(12) United States Patent
Pettibone

(10) Patent No.: US 7,294,320 B2
(45) Date of Patent: Nov. 13, 2007

(54) HYDROGEN PEROXIDE ABATEMENT OF METAL HYDRIDE FUMES

(75) Inventor: Glen J. Pettibone, Lake Forest, CA (US)

(73) Assignee: Applied Materials, Inc., Santa Clara, CA (US)

( * ) Notice: Subject to any disclaimer, the term of this patent is extended or adjusted under 35 U.S.C. 154(b) by 453 days.

(21) Appl. No.: 10/943,723

(22) Filed: Sep. 17, 2004

(65) Prior Publication Data

US 2006/0062708 A1   Mar. 23, 2006

(51) Int. Cl.
*B01D 53/46* (2006.01)
*G05D 7/00* (2006.01)

(52) U.S. Cl. .................. 423/210; 422/105; 422/111
(58) Field of Classification Search ............... 423/210; 422/105, 111
See application file for complete search history.

(56) References Cited

U.S. PATENT DOCUMENTS

| | | | |
|---|---|---|---|
| 5,300,185 A | | 4/1994 | Hori et al. |
| 5,527,517 A | * | 6/1996 | Bridges et al. ............. 423/210 |
| 5,651,917 A | * | 7/1997 | Bridges et al. ........ 252/186.41 |
| 5,863,598 A | | 1/1999 | Venkatesan et al. |
| 5,945,078 A | * | 8/1999 | Taylor et al. ................ 423/210 |
| 6,322,756 B1 | | 11/2001 | Arno et al. |
| 6,468,490 B1 | | 10/2002 | Shamouilian et al. |
| 2003/0049372 A1 | | 3/2003 | Cook et al. |
| 2004/0107833 A1 | | 6/2004 | Sweeney et al. |
| 2004/0213721 A1 | * | 10/2004 | Arno et al. ............. 423/240 R |

* cited by examiner

*Primary Examiner*—Timothy C. Vanoy
(74) *Attorney, Agent, or Firm*—Patterson & Sheridan, LLP

(57) ABSTRACT

A method and apparatus for reducing the level of metal hydride found in effluent of a process chamber is disclosed. The method includes introducing hydrogen peroxide into the process chamber to react with metal hydride and reduce the level of metal hydride to a level under a permissible exposure limit. Additionally, an apparatus having a process chamber and a vaporizing device for introducing hydrogen peroxide into the process chamber is disclosed.

39 Claims, 5 Drawing Sheets

HYDROGEN PEROXIDE ABATEMENT OF METAL HYDRIDE FUMES

BACKGROUND OF THE INVENTION

1. Field of the Invention

Embodiments of the present invention generally relate to abatement of hazardous materials in a process chamber, and more particularly to a method and apparatus for reducing the level of metal hydrides that remain in the process chamber after semiconductor processing.

2. Description of the Related Art

During semiconductor substrate processing, reaction by-products, vapor, fumes, and other materials are routinely generated and need to be abated in accordance with various government safety guidelines. Currently, in order to make a process chamber safe to be opened after substrate processing, atmospheric air is repeatedly introduced into the process chamber to react with and neutralize the often toxic fumes or materials and subsequently pumped out of the chamber.

Generally, after depositing silicon material, such as metal-doped polysilicon, on a substrate inside a chemical vapor deposition (CVD) chamber, toxic gases, such as metallic gases, metal hydrides fumes, and transition oxides are generated at levels much higher than Permissible Exposure Limits. In order to reduce the level of metal hydride fumes to safe levels after substrate processing, atmospheric air needs to be pumped in a number of times (e.g., at least 100 cycles, each cycle lasting for about 15-20 minutes). This is a lengthy process, typically requiring days of pumping and purging the CVD chamber to reduce the level of metal hydride before the CVD chamber can be opened and available for another cycle of substrate processing.

Therefore, there is a need for a technique to cost effectively abate post-processing toxic materials and safely shorten the amount of abatement time, such that the cycle time required for substrate processing is reduced.

SUMMARY OF THE INVENTION

The invention provides a method and apparatus for reducing the level of metal hydride in a process chamber. The method includes introducing hydrogen peroxide into the chamber to react with metal hydride and reduce the level of metal hydride in the chamber. A carrier gas for hydrogen peroxide is used to supply the hydrogen peroxide into the chamber.

After introducing hydrogen peroxide into the chamber, a purge gas may be used to remove excess hydrogen peroxide and residual metal hydride. During this purging step, the temperature of the chamber is maintained at a temperature of between about 150° C. and about 350° C.

According to another aspect of the invention, the hydrogen peroxide is introduced into the process chamber having the metal hydride gas during cooling down of the chamber after semiconductor substrate processing.

According to another aspect of the invention, the level of metal hydride in the chamber is detected by a detector and monitored throughout the abatement process, and a volume of hydrogen peroxide is introduced into the chamber until the monitored level of the metal hydride is under a permissible exposure limit. To avoid gas detector saturation by hydrogen peroxide that could obscure the gas detector readings, the chamber is baked at 200° C. for 40 minutes with a 30 slm nitrogen purge.

The apparatus according to the invention includes a process chamber and a vaporizing device connected to the chamber to introduce hydrogen peroxide into the chamber in gaseous form. Additionally, a control valve connected to the vaporizing device controls the amount of the hydrogen peroxide flowing into the process chamber, and a gas conduit connected to the vaporizing device supplies a carrier gas for the hydrogen peroxide. A gas detector is also provided to detect the level of metal hydride in the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The invention generally provides a method and apparatus for abatement of metal hydride gases in effluent, such as excess process gases/materials, reaction by-products, and other gases, vapors, and fumes are readily generated during semiconductor substrate processing. For example, metal hydride gases, such as silane, germane, group V metal hydrides gases (e.g., phosphine, arsine, etc.) are usually delivered into a process chamber in order to deposit metal doped silicon film on a substrate by a conventional chemical vapor deposition (CVD) method, plasma enhanced chemical vapor deposition (PECVD) method or a metal organic chemical vapor deposition (MOCVD) method. One exemplary deposition process generating metal hydride gas includes an arsine in-situ deposition (As-ISD) process for depositing an arsine-doped polysilicon layer in a chemical vapor deposition chamber. In addition, metal hydride gases can also be used as primary dopant gases in ion implantation sputtering processes. Such toxic, flammable, and corrosive metal hydride gases are considered health and environmental hazards and often corrode the exhaust system of the chamber.

The invention provides an efficient and economical way to abate such metal hydride gases and is applicable to a variety of substrate processing techniques, including, but not limited to, chemical vapor deposition (CVD), low pressure chemical vapor deposition (LPCVD), metal organic chemical vapor deposition (MOCVD), plasma enhanced chemical vapor deposition (PECVD), molecular beam epitaxy (MBE), atomic layer deposition (ALD), physical vapor deposition (PVD), sputtering, ion implantation, and combinations thereof. In addition, the invention is applicable to a variety of other confined spaces where metal hydride gases are present and hydrogen peroxide may act as a source of ignition to reduce the level of metal hydride gases.

Figure 1:
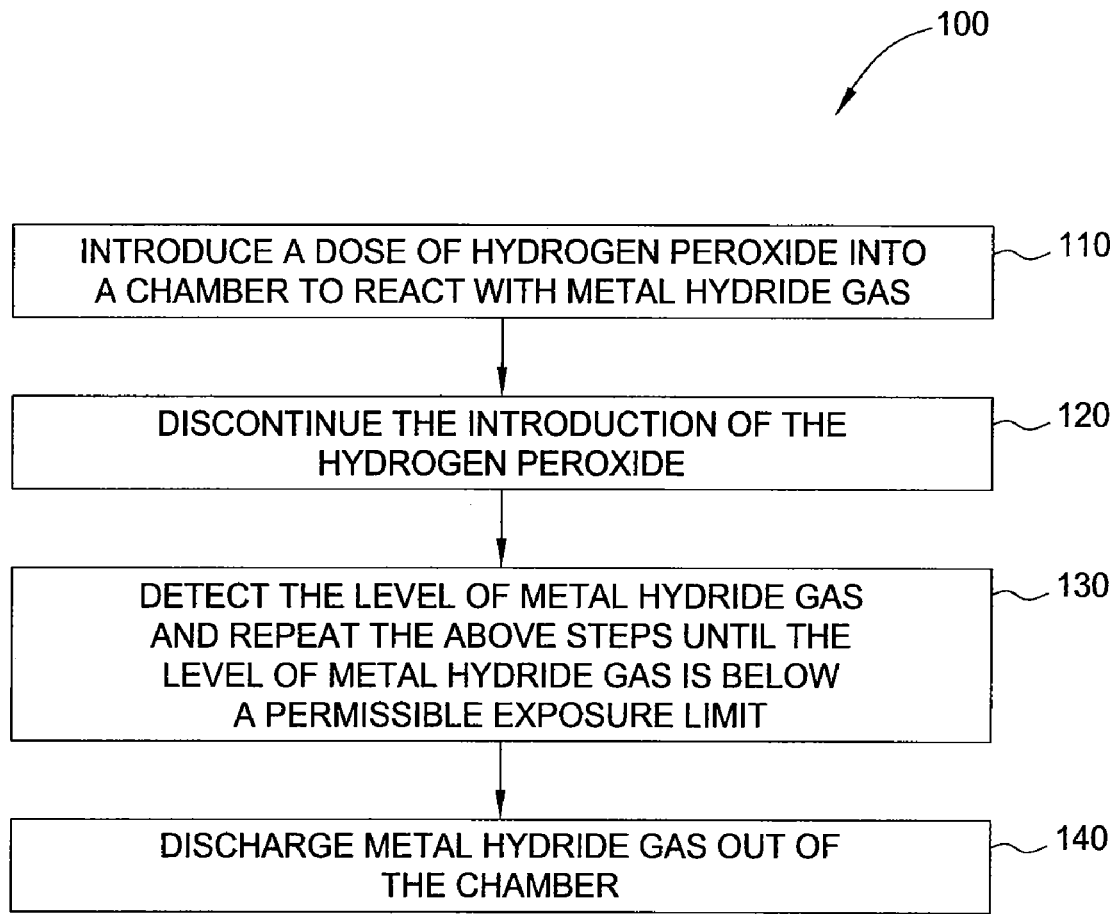
FIG. 1 is a process flow diagram illustrating a first method incorporating one embodiment of the invention.

One exemplary abatement method 100 is illustrated in FIG. 1. The method 100 includes introducing at least one dose of hydrogen peroxide into a process chamber to react with metal hydride gas at step 110. The hydrogen peroxide reacts with the metal hydride gas and reduces the level of metal hydride gas to a safe level so that the process chamber can be exposed to the environment. The metal hydride gas whose level inside the process chamber can be reduced by hydrogen peroxide include arsine ($AsH_3$), silane ($SiH_4$), phosphine ($PH_3$), germane ($GeH_4$), and combinations thereof.

Hydrogen peroxide used herein may be in liquid, gas, or other form. If the hydrogen peroxide is used in liquid form, a concentration of about 5% to about 100% by weight, such as about 50% by weight, can be used. As an example, high concentration and high purity, such as CMOS grade, Ultra Pure grade or above, of hydrogen peroxide is used. In addition, the exact volume of the liquid or gas form of hydrogen peroxide is not limited and is dependent on the volume of the chamber having metal hydride gas that need to be abated, and the efficiency of the hydrogen peroxide abatement of the metal hydride gas.

When a non-gas phase form of hydrogen peroxide is used, the hydrogen peroxide is subjected to a vaporization step. A carrier gas can be used in such a vaporization step to help deliver the hydrogen peroxide into the chamber. For example, atmospheric air or nitrogen, which is relatively inexpensive and easy to handle, can be forced through the liquid hydrogen peroxide and bubble the hydrogen peroxide into a vapor form in order to fill the volume of the chamber. Many other different types of readily available carrier gases, such as oxygen gas, hydrogen gas, argon, helium, oxygen-containing gases, hydrogen-containing gases, nitrogen-containing gases, and mixtures thereof, are compatible with hydrogen peroxide and may be used as the carrier gas. When atmospheric air is used as a carrier gas, it is simply introduced from an air inlet and the pressure of the chamber is maintained close to atmospheric pressure, such as about 740 mTorr.

At step 120, the introduction of the hydrogen peroxide is discontinued. For example, once a desired volume of liquid hydrogen peroxide has been introduced to fill up the chamber, the carrier gas will stop supplying the hydrogen peroxide into the chamber. After the hydrogen peroxide is discontinued, the carrier gas may optionally be continuously introduced into the chamber for a desired time period.

At step 130, the level of the metal hydride gas in the process chamber is detected. If the detected level of the metal hydride gas exceeds a Permissible Exposure Limit, additional doses of hydrogen peroxide are introduced into the chamber. The level of the metal hydride gas is monitored throughout the abatement process until the level of the metal hydride gas is below a Permissible Exposure Limit. The Permissible Exposure Limit is set by government environment safety agencies for certain harmful, hazardous gases/materials below which it is safe to discharge them out to the environment. The Permissible Exposure Limit for arsine (arsenic hydride) is 0.041 ppb/sec.

Hydrogen peroxide accelerates the abatement process by acting as a source of ignition to react with metal hydride gases. It has a much higher density than oxygen and water such that spontaneous reactions, enhanced reaction kinetics, and stronger exothermic reactions may be favored. For example, when the hydrogen peroxide is used to abate arsine, forward and exothermic reaction is expected to generate reaction products of arsenic oxide ($As_2O_5$) and hydrogen gas ($H_2$). Thus, the toxicity of the arsine is neutralized and non-volatile arsenic oxides that are immiscible with skin and safe to expose to the environment are generated. At step 140, the metal hydride gas is discharged out of the chamber. An exhaust system capable of achieving a minimum pressure of about $10^{-3}$ mTorr in the chamber can be used.

Figure 2:
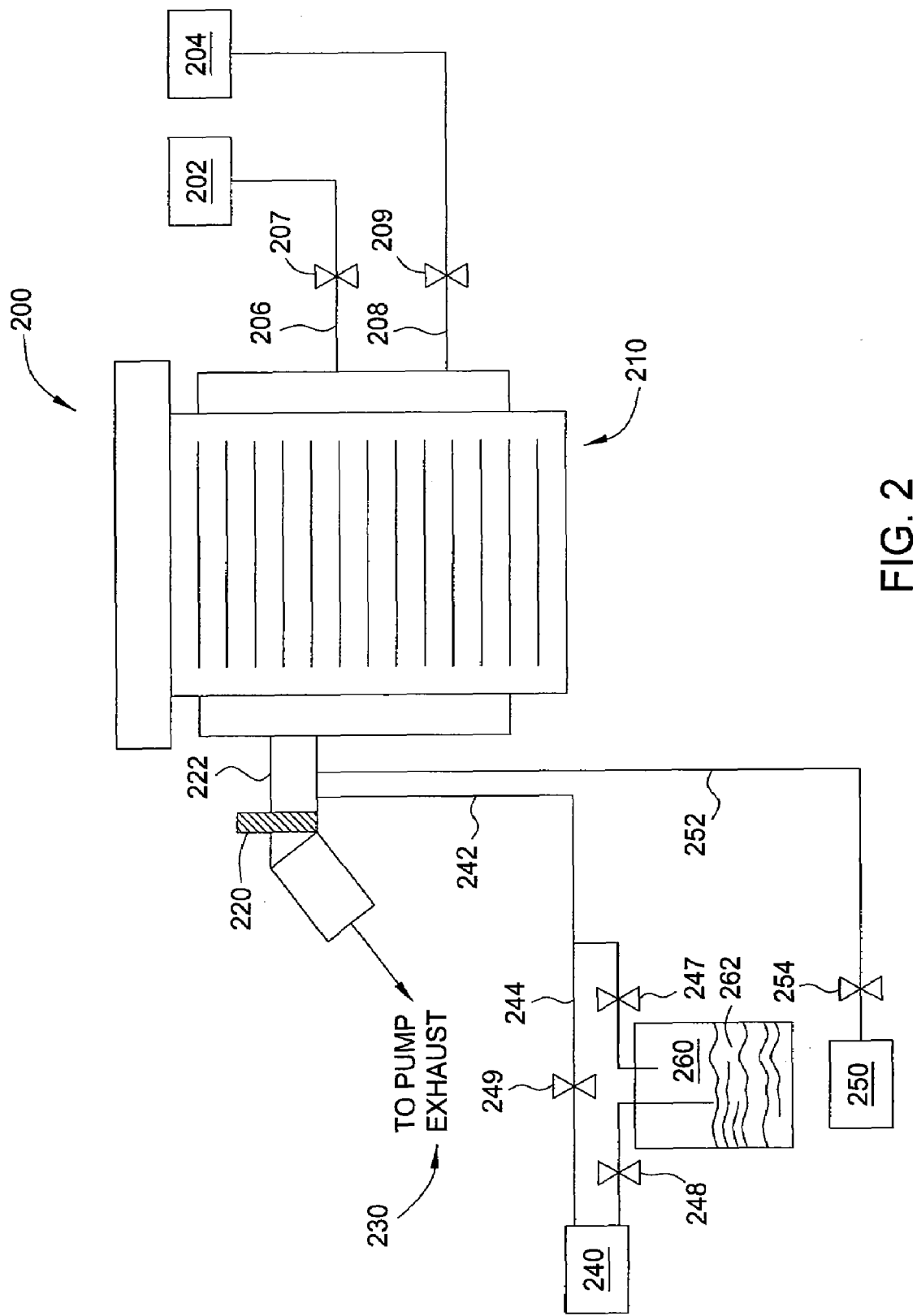
FIG. 2 is a block diagram of semiconductor processing system including an abatement system according to one embodiment of the invention.

FIG. 2 is a cross sectional view of a semiconductor processing system 200 including an abatement system according to one embodiment of the present invention. The semiconductor processing system 200 includes a process chamber 210, a pump exhaust system 230, a vaporizing device 260 for delivering the hydrogen peroxide, and a gas detector 250. Reactant gases from gas supplies 202, 204 are injected into the chamber 210 through gas lines 206 and 208 and controlled by valves 207 and 209. Unwanted gas phase reactions can be avoided using two or more gas lines to deliver reactant gases separately before being injected into the chamber and mixed at high pressure. Gases in the process chamber 210 are typically maintained at low pressure during processing.

The types of the reactant gases may vary depending on the films to be deposited on a substrates and types of deposition techniques used. For example, gas supplies 202, 204 may include various metal-containing gases for depositing a metal material on the substrate, silicon-containing gases, metal hydrides gases, or a carrier gas for gas supplies 202, 204. Often a carrier gas for reactant gases may also be delivered into the chamber through gas lines 206, 208. In one embodiment, a metal hydride gas is delivered into the process chamber 210 through gas lines 206, 208 at a high flow rate for epitaxial dielectric material deposition. As a result, the process chamber 210 is filled with the metal hydride gas and excess metal hydride gas needs be abated after substrate processing.

Additionally, purge gas, including nitrogen gas, inert gases (such as argon or helium) can be supplied into the process chamber 210 to prevent gas supplies 202, 204 from entering into non-processing region or ingress of reactant gases inside the process chamber 210. The purge gas, inert gas, excess process gases, reaction by-products is exhausted directly into a foreline 222 of the pump exhaust system 230.

A throttle valve 220 is connected to the pump exhaust system 230 which leads to one or a plurality of pumps, such as roughing and high vacuum pumps, that evacuate the gases in the process chamber 210. The throttle valve 220 is provided for controlling the pressure of the gases in the process chamber 210 to achieve a minimum pressure of about $10^{-3}$ mTorr.

The semiconductor processing system 200 additionally includes a conduit 242 for delivery of an abatement gas, such as atmospheric air or hydrogen peroxide, among others, into the process chamber 210. The conduit 242 is connected to a carrier gas inlet 240 and a vaporizing device 260. Carrier gas is forced through a vaporizing device 260 to bubble hydrogen peroxide that is stored in a passivated container 262 in liquid form and supply hydrogen peroxide in gaseous form into the process chamber 210. The amount of hydrogen peroxide flowing into the process chamber 210 is controlled by a bubbler dip tube valve 247, connected to the conduit 242 leading to the foreline 222 of the process chamber 210.

A carrier gas inlet 240 is connected to the foreline 222 of the process chamber 210 directly through a conduit 244 as controlled by a valve 249. In addition, the carrier gas inlet 240 is connected to the vaporizing device 260 through a valve 248 in order for the carrier gas to flow into the container 262. The carrier gas inlet 240 may be connected to outside atmospheric air to use as a carrier gas or, alternatively, to a carrier gas containing device for various suitable carrier gases.

Carrier gas flowing through the carrier gas inlet 240 delivers the hydrogen peroxide out of the container 262, through the bubbler dip tube valve 247, and into the foreline of the process chamber 210 in order to back fill the process chamber when the throttle valve 220 is closed. Similarly, the hydrogen peroxide may be propelled from a spray paint nozzle device, a canister, or a venture valve, for delivering the hydrogen peroxide as a mist or a vapor into a much larger volume of a space that are fumed with air toxics, chemical weapons, and other reactive gases.

Figure 3:
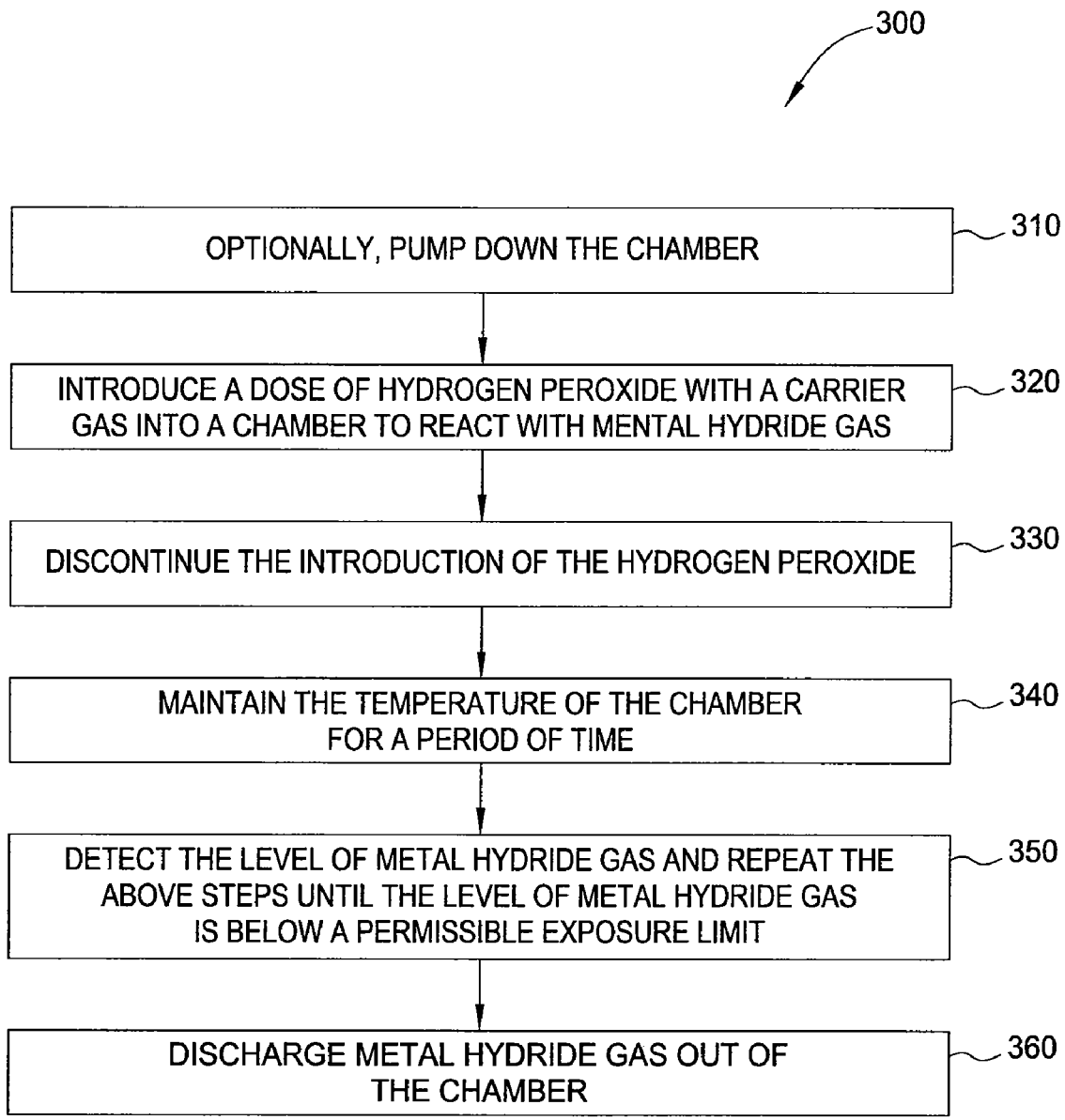
FIG. 3 is a process flow diagram illustrating a second method incorporating one embodiment of the invention.

FIG. 3 is a process flow diagram of a second embodiment of the invention that may be performed using a processing apparatus such as the substrate processing system 200 shown in FIG. 2. In the method 300 shown in FIG. 3, the temperature of the chamber is maintained for a period of time after a dose of hydrogen peroxide is introduced into the chamber to help the abatement of metal hydride by hydrogen peroxide, prior to pumping any metal hydride gases out of the chamber.

At step 310, the chamber is optionally pumped down to a base pressure of about 50 mTorr or less. At step 320, a dose of hydrogen peroxide as vaporized by a carrier gas is introduced into the chamber to react with a metal hydride gas in the chamber. At step 330, the introduction of the hydrogen peroxide is discontinued. At step 340, the temperature of the chamber is maintained at a temperature between about 150° C. and about 350° C. for about 40 minutes. The temperature helps to maintain the vaporized state of the hydrogen peroxide that have been introduced into the chamber.

At step 350, the level of the metal hydride is detected by a gas detector, and the above steps can be repeated to introduce additional doses of hydrogen peroxide into the chamber if the detected level of the metal hydride gas exceeds a Permissible Exposure Limit. At step 360, the metal hydride gas is discharged out of the chamber by an exhaust system.

Figure 4:
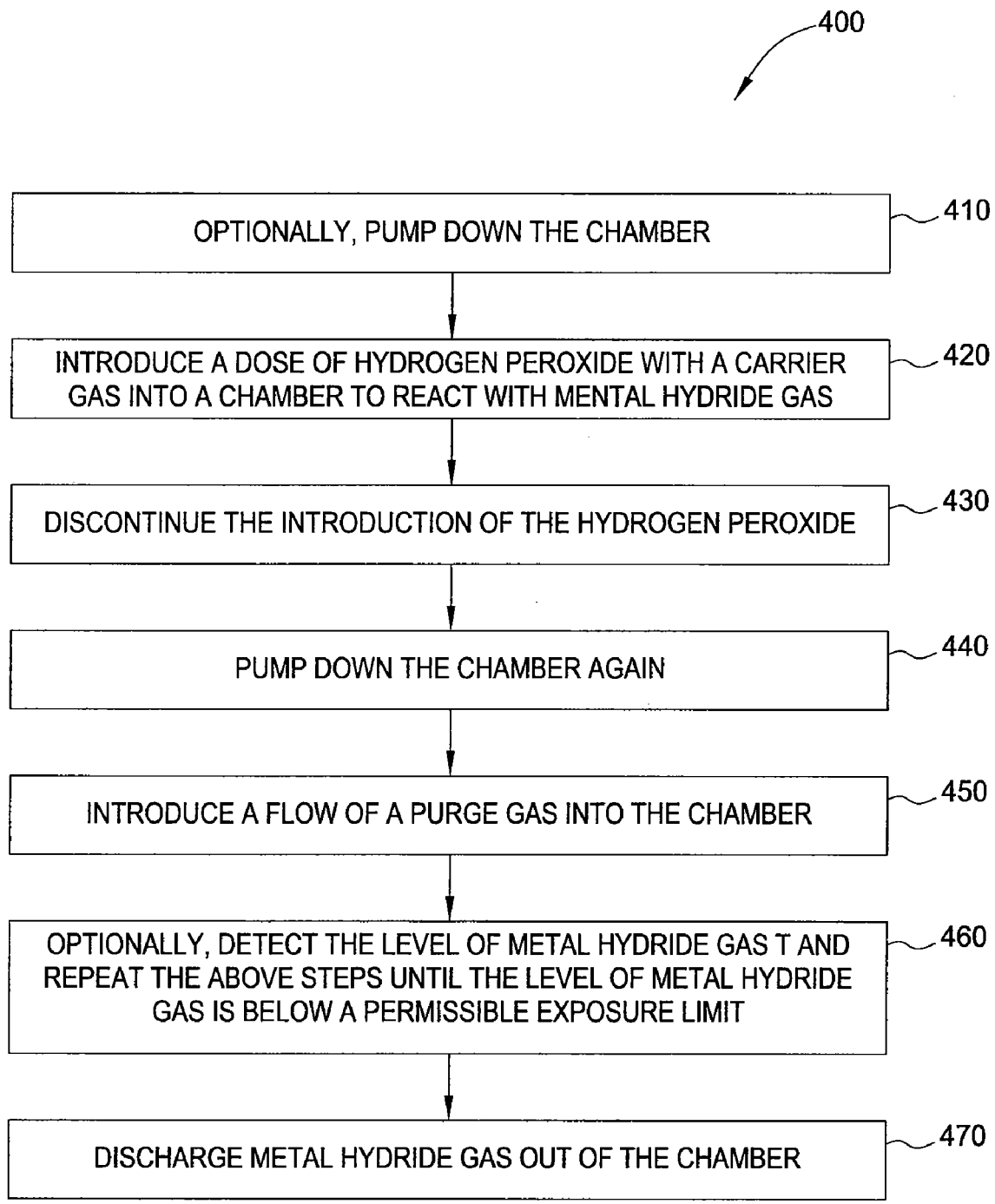
FIG. 4 is a process flow diagram illustrating a third method incorporating one embodiment of the invention.

FIG. 4 is a flow diagram of an exemplary method 400 showing a third embodiment of the invention. In the embodiment shown in FIG. 4, after the abatement of a metal hydride gas using hydrogen peroxide, purge gas is introduced into the chamber to further clean up any residual hydrogen peroxide and other gases.

At step 410, the chamber is optionally pumped down to a base pressure. At step 420, a dose of hydrogen peroxide as vaporized by a carrier gas is introduced into the chamber to react with a metal hydride gas in the chamber. At step 430, the introduction of the hydrogen peroxide is discontinued. At step 440, the chamber is pumped down again in order to introduce purge gas into the chamber at step 450. The purge gas further cleans up and removes unwanted gases or fumes from the chamber and any peripheral space of the substrate processing system. Exemplary purge gas that can be used herein includes, but is not limited to, nitrogen gas, oxygen gas, hydrogen gas, argon, helium, atmospheric air, any other oxygen-containing gases, hydrogen-containing gases, nitrogen-containing gases, and mixtures thereof, among others.

At step 460, the level of metal hydride gas is detected by a gas detector, and the above steps can be repeated to introduce additional doses of hydrogen peroxide into the chamber if the detected level of the effluent exceeds a Permissible Exposure Limit. At step 470, the metal hydride gas is discharged out of the chamber by an exhaust system.

The combination of the methods 300 and 400 provides another embodiment of the invention. First of all, the chamber is optionally pumped down to a base pressure and a dose of hydrogen peroxide vaporized by a carrier gas, such as air, is introduced into the chamber to react with metal hydride gas for a period of time and then discontinued. The pressure of the chamber is maintained close to atmospheric pressure when the hydrogen peroxide is carried in by atmospheric air. Then, the chamber is pumped down again. Additional doses of hydrogen peroxide may be introduced in intervals to further abate the metal hydride fumes. Next, purge gas is introduced into the chamber and the temperature of the chamber is maintained at a temperature between about 150° C. and about 350° C. The temperature of the chamber is typically maintained by a heating/cooling system near a substrate support located inside the chamber. The combination of high temperature baking and purge gas further cleans up the chamber from any excess hydrogen peroxide and/or metal hydride fumes. Thereafter, metal hydride gas is discharged out of the chamber by an exhaust system. Additionally, the above abatement methods 100, 300 and 400 can be conveniently performed during the cool down period of the semiconductor processing system such that cycle time and throughput of a substrate deposition process can be improved.

The following illustrates another example of the present invention. An arsine in-situ doped (As-ISD) polysilicon film was deposited using a chemical vapor deposition chamber that may be part of an integrated processing platform. In particular, the film was deposited on a FlexStar LPCVD silicon chamber, available from Applied Materials, Inc. of Santa Clara, Calif.

Flows of silane ($SiH_4$) and about 1% of arsine ($AsH_3$) were introduced into the deposition system at a flow rate of about 4.8 slm (standard liters per minute) and about 0.16 slm, respectively, for about 1920 minutes. It is estimated that about 0.1086 moles of arsine was flowed into the chamber. Total deposition was estimated at about 3840 Å of arsine-doped polysilicon film at a deposition rate of about 2 Å/min. As a result, arsine hydride fume was generated at a rate of about 10 part per billion (ppb) per second per chamber, which is about $1 \times 10^6$ liters per second or $4.46 \times 108$ moles per second. The concentration is well above the Permissible Exposure Limit of 50 ppb per 20 minutes (about 0.04167 ppb/sec). Conventionally, the arsine hydride fume can not be abated with nitrogen gas or vacuum, at room temperature or elevated temperatures, unless it is exposed to atmospheric air (at about room temperature) using repetitive pumping and air purging for 20 minutes per cycle for more than about 48 hours with atmospheric air for a total of more than about 100 cycles. The resulting abatement products are non-volatile arsenic oxides.

Figure 5:
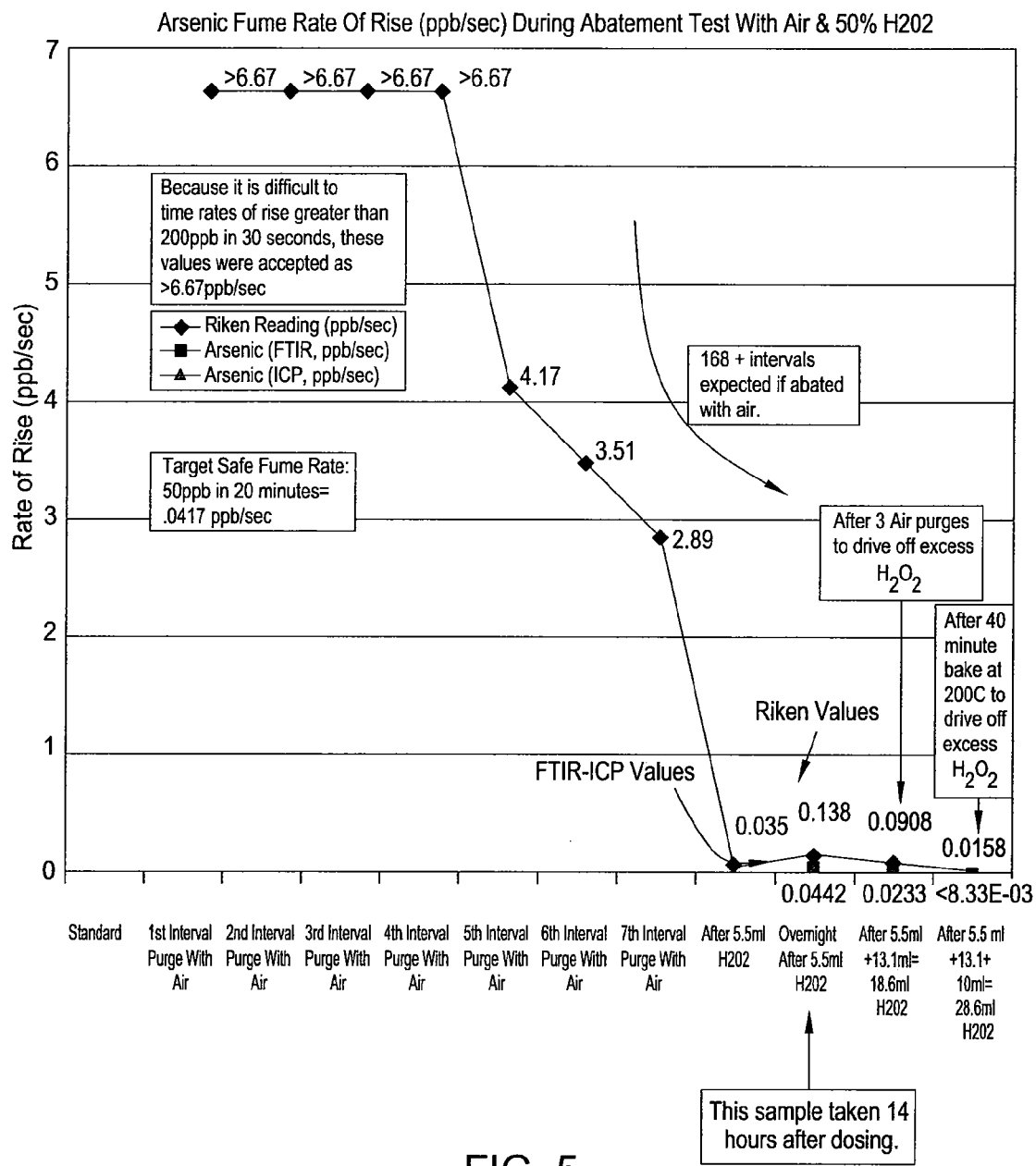
FIG. 5 illustrates the effect of hydrogen peroxide on arsine hydride levels.

FIG. 5 illustrates the effect of hydrogen peroxide on the abatement of arsine hydride, as compared to abatement with atmospheric air alone. After deposition of the arsine-doped polysilicon film, the chamber was pumped down to a base vacuum pressure of about 10 mTorr and the throttle valve of the chamber is closed in order to fill/purge the chamber with atmospheric air introduced into the chamber through an air gas line. The pressure of the chamber is thus increased to nearly atmospheric pressure of about 740 Torr. Then, a sample of the arsine hydride fume was taken out through a sampling line 252 controlled by a valve 254 and connected to the chamber and the level of the arsine hydride fume was measured for at least about 20 minutes by a gas detector, such as a Riken Keiki GD-K70 detector. The reading from the Riken gas detector was taken as fume rate of rise.

As shown in FIG. 5, initially, the detected level of the arsenic hydride fume, as abated with atmospheric air, was more than 6.67 ppb/sec. Even after seven intervals of atmospheric air abatement (about 20 minutes in each interval), the detected level of the arsenic hydride fume is still as high as about 2.89 ppb/sec. It is thus estimated that at least more than 168 cycles (more than 56 hours) would be needed if the atmospheric air abatement process continued.

FIG. 5 demonstrates that abatement of arsenic hydride fumes is greatly accelerated if hydrogen peroxide (about 50% by weight) is introduced into the chamber. Prior to its introduction into the chamber, hydrogen peroxide was stored in liquid form in a passivated container. A carrier gas, such as atmospheric air, flows through the top space of the passivated container to bubble the hydrogen peroxide into vapor form and carry the hydrogen peroxide into the chamber. After about 5.5 milliliters of the hydrogen peroxide was introduced into the chamber, the level of the arsenic hydride fume was measured. As shown in FIG. 5, after the first dose of the hydrogen peroxide, the level of the arsenic hydride fume in the chamber is reduced to 0.035 ppb/sec, which is about 25% below the Permissible Exposure Limit of 0.041 ppb/sec. The results demonstrate a dramatic drop in the level of the arsenic hydride fume to safe levels even with just one single dose of hydrogen peroxide. Thus, the abatement of toxic arsine hydride fumes by hydrogen peroxide dramatically shortens the abatement process from about 56 hours to about 20 minutes.

Also shown in FIG. 5, additional doses of hydrogen peroxide were introduced to further reduce the detected level of the arsenic hydride fume to 0.0158 ppb/sec. The chamber was also purged with atmospheric air after the second dose to drive off excess hydrogen peroxide in the chamber and was baked for 40 minutes at about 200° C. after the third dose to drive off excess hydrogen peroxide.

While the foregoing is directed to embodiments of the present invention, other and further embodiments of the invention may be devised without departing from the basic scope thereof, and the scope thereof is determined by the claims that follow.

The invention claimed is:

1. A method of reducing the level of hydride in a substrate process chamber, comprising:
introducing hydrogen peroxide into the substrate process chamber to react with the hydride and reduce the level of the hydride in the substrate process chamber, wherein the hydride comprises silane, phosphine, germane, arsine, or any combination thereof.

2. The method of claim 1, further comprising: introducing a carrier gas for the hydrogen peroxide into the substrate process chamber.

3. The method of claim 2, wherein the carrier gas is selected from the group consisting of atmospheric air, oxygen, argon, nitrogen-containing gas, nitrogen gas, hydrogen-containing gas, hydrogen gas, and combinations thereof.

4. The method of claim 1, wherein the hydrogen peroxide is introduced in intervals.

5. The method of claim 1, wherein the hydrogen peroxide is stored in liquid form before it is introduced into the substrate process chamber.

6. The method of claim 5, wherein the hydrogen peroxide is introduced through a vaporizing device connected to the substrate process chamber.

7. The method of claim 5, wherein the hydrogen peroxide is stored at a concentration of about 5% to about 100% by weight.

8. The method of claim 7, wherein the hydrogen peroxide is stored at a concentration of about 50%.

9. The method of claim 1, wherein the hydrogen peroxide is introduced into the substrate process chamber having a chamber pressure of less than about 50 mTorr.

10. The method of claim 1, further comprising:
introducing an oxygen-containing gas into the substrate process chamber prior to introducing the hydrogen peroxide.

11. The method of claim 10, wherein the oxygen-containing gas is introduced in intervals.

12. The method of claim 10, wherein the oxygen-containing gas is selected from the group consisting of atmospheric air, oxygen, ozone, nitrogen dioxide, and combinations thereof.

13. The method of claim 12, wherein the oxygen-containing gas is atmospheric air.

14. The method of claim 13, wherein the atmospheric air is introduced to fill the substrate process chamber to a chamber pressure of up to about 740 Torr.

15. The method of claim 1, further comprising:
purging the substrate process chamber with a purge gas to remove excess hydrogen peroxide and residual hydride after introducing the hydrogen peroxide into the process chamber.

16. The method of claim 15, wherein purging the substrate process chamber is performed at a temperature between about 150° C. and about 350° C.

17. The method of claim 15, wherein the purge gas is selected from the group consisting of nitrogen-containing gas, nitrogen gas, hydrogen-containing gas, hydrogen gas, helium, argon, an oxygen-containing gas, atmospheric air, oxygen, ozone, nitrogen dioxide, and combinations thereof.

18. The method of claim 17, wherein the purge gas is atmospheric air.

19. The method of claim 18, wherein the atmospheric air is introduced to fill the substrate process chamber to a chamber pressure of up to about 740 Torr.

20. The method of claim 18, wherein the atmospheric air is introduced in intervals.

21. The method of claim 17, wherein the purge gas is nitrogen gas.

22. The method of claim 1, wherein the hydrogen peroxide is introduced into the substrate process chamber at a temperature between about 25° C. and about 250° C.

23. The method of claim 1, wherein the hydrogen peroxide is introduced into the substrate process chamber after processing a substrate with a hydride-containing gas in the process chamber and during cooling down the temperature of the process chamber.

24. A method of controlling the level of hydride after processing a substrate in a substrate process chamber, comprising:
monitoring the level of the hydride in the substrate process chamber, wherein the hydride comprises silane, phosphine, germane, arsine, or any combination thereof; and
introducing hydrogen peroxide into the substrate process chamber until the monitored level of the hydride is under a permissible exposure limit.

25. The method of claim 24, further comprising:
introducing a carrier gas for the hydrogen peroxide into the substrate process chamber.

26. The method of claim 24, wherein the hydrogen peroxide is introduced in intervals.

27. The method of claim 24, wherein the hydrogen peroxide is stored in liquid form before it is introduced into the substrate process chamber.

28. The method of claim 27, wherein the hydrogen peroxide is introduced through a vaporizing device connected to the substrate process chamber.

29. The method of claim 27, wherein the hydrogen peroxide is stored at a concentration of about 5% to about 100% by weight.

30. The method of claim 24, wherein the level of the hydride is monitored by a gas detector.

31. The method of claim 24, further comprising:
purging the substrate process chamber with a purge gas to remove excess hydrogen peroxide and residual hydride after introducing the hydrogen peroxide into the process chamber.

32. The method of claim 31, wherein purging the process chamber is performed at a temperature of between about 150° C. and about 350° C.

33. The method of claim 31, wherein the purge gas is selected from the group consisting of nitrogen-containing gas, nitrogen gas, hydrogen-containing gas, hydrogen gas, helium, argon, an oxygen-containing gas, atmospheric air, oxygen, ozone, nitrogen dioxide, and combinations thereof.

34. The method of claim 31, wherein the purge gas is introduced in intervals.

35. The method of claim 34, wherein the purge gas is atmospheric air.

36. The method of claim 31, wherein the purge gas is introduced continuously for a period of time.

37. The method of claim 36, wherein the purge gas is nitrogen gas.

38. The method of claim 24, wherein the hydrogen peroxide is introduced into the substrate process chamber at a temperature between about 25° C. and about 250° C.

39. The method of claim 24, wherein the hydrogen peroxide is introduced into the substrate process chamber after processing a substrate with a hydride-containing gas in the substrate process chamber and during cooling down of the process chamber.

* * * * *